(12) United States Patent
Kozyrev et al.

(10) Patent No.: US 10,298,213 B2
(45) Date of Patent: May 21, 2019

(54) TUNABLE-FREQUENCY PULSE FORMING NETWORKS FOR HIGH POWER MICROWAVE APPLICATIONS

(71) Applicant: BAE SYSTEMS Information and Electronic Systems Integration Inc., Nashua, NH (US)

(72) Inventors: Alexander B. Kozyrev, Rockville, MD (US); Simon Y. London, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 627 days.

(21) Appl. No.: 14/982,085

(22) Filed: Dec. 29, 2015

(65) Prior Publication Data
US 2016/0187463 A1  Jun. 30, 2016

Related U.S. Application Data (60) Provisional application No. 62/098,444, filed on Dec. 31, 2014.

(51) Int. Cl.
*H03K 3/53* (2006.01)
(52) U.S. Cl.
CPC ..................... *H03K 3/53* (2013.01)
(58) Field of Classification Search
CPC ..................................................... H03K 3/53
USPC ............................................................ 342/14
See application file for complete search history.

(56) References Cited

U.S. PATENT DOCUMENTS

| | | | |
|---|---|---|---|
| 3,290,678 A * | 12/1966 | Carlsson | G01S 7/28 342/199 |
| 2013/0082695 A1* | 4/2013 | Johnson | G01R 15/207 324/243 |

* cited by examiner

*Primary Examiner* — Peter M Bythrow
*Assistant Examiner* — Helena H Seraydaryan
(74) *Attorney, Agent, or Firm* — Davis & Bujold, PLLC (57) ABSTRACT

A tunable frequency transmission line pulse forming network circuit for forming a waveform having a spectral content. The pulse forming network circuit comprises a dielectric material; a ground section; a stepped shaped charged section, with the charged section having a plurality of stages including a first stage; a power supply coupled to the pulse forming network circuit for charging the pulse forming network circuit; a switch coupled to the pulse forming network circuit for periodically discharging the pulse forming network circuit; and an antenna coupled to the pulse forming network circuit for propagating a high-power microwave signal from the pulse forming network circuit into the environment. At least the first stage of pulse forming network circuit has one of a tunable magnetic material and a nonlinear magnetic which facilitates adjusting the waveform and the spectral content of the waveform emitted by the pulse forming network circuit into the surrounding environment.

20 Claims, 10 Drawing Sheets

TUNABLE-FREQUENCY PULSE FORMING NETWORKS FOR HIGH POWER MICROWAVE APPLICATIONS

BACKGROUND OF THE INVENTION

1. Field of the Invention

This invention relates to directed energy weapons, and more particularly, to high power microwave weapons.

2. Brief Description of Related Art

Conventional high power microwave (HPM) sources incorporating pulse forming networks (PFNs) based on segments of charged transmission lines (also known as a family of Darlington circuits) have fixed spectral content which is determined by the electrical length. However, potential customers indicate a lot of interest in frequency agile HPM sources and in sources capable of generating arbitrary waveforms since different targets are vulnerable to different frequencies and different waveforms.

As is conventional in the art and used within this patent application, a pulse forming network (PFN) is an electric circuit that accumulates electrical energy over a comparatively long time, then releases this stored energy in the form of a relatively square pulse of a comparatively brief duration for various pulsed power applications. In the PFN circuit, the energy storage components, such as capacitors, inductors or transmission lines are charged by means of a high voltage power source, then rapidly discharged into a load via a high voltage switch, e.g., as a spark gap, a hydrogen thyratron or a photoconductive semiconductive switch. Repetition rates range from single pulses to about $10^4$ per second. PFN circuits are used to produce precise nanosecond-length pulses of electricity to power devices such as klystron or magnetron tube oscillators in radar sets, pulsed lasers, particle accelerators, flashtubes, and high voltage utility test equipment. A lot of high energy research equipment is operated in a pulsed mode, both to keep heat dissipation down and because high energy physics often occur at short time scales, so large PFN circuits are widely used in high energy research. They have been used to produce nanosecond length pulses with voltages of up to $10^6$-$10^7$ volts and currents up to $10^6$ amps, with peak power in the terawatt range, similar to lightning bolts.

Conventional PFN circuits consist of the segments of transmission lines having the same electrical length but different impedances. An example of such pulse forming circuits is the Blumlein pulse-forming line. The Blumlein pulse-forming line is, in fact, the simplest member of the entire family of circuits known as the Darlington circuits. These circuits are capable of producing unipolar (Darlington) or bipolar (S. London) single-cycle rectangular pulses as well as trains of such pulses. These circuits also produce such pulses at potentials which can be many multiples of the potential to which the circuit is charged initially. The electrical length of the transmission line segments in conventional pulse-forming networks is fixed. This fixed electrical length, in turn, fixes duration of the generated pulses as well as their spectral content.

Figure 1:
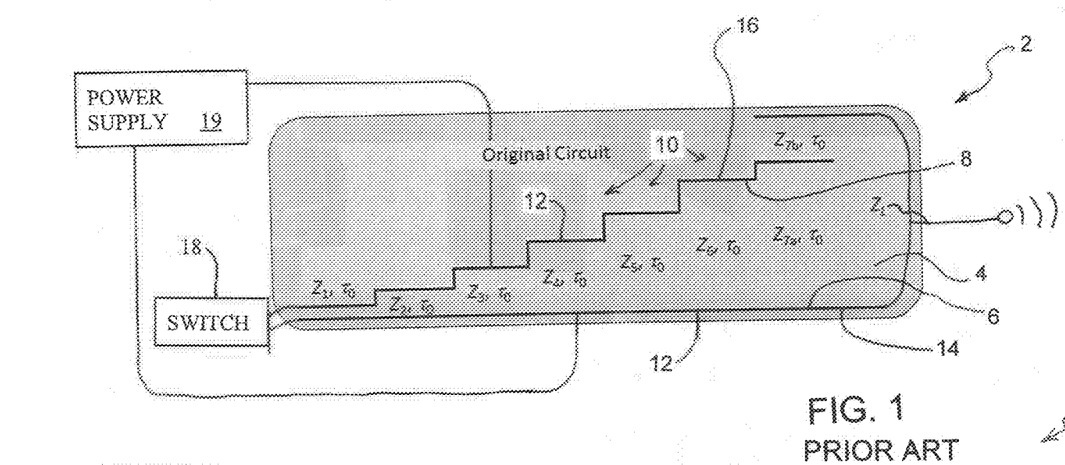
FIG. 1 is a diagrammatic representation showing a conventional single-cycle pulse forming network according to the prior art.

With reference now to FIG. 1, a description concerning a conventional prior art circuit 2 will now be briefly described. As is conventional in the art, the central core component of such prior art circuit 2 is a block of dielectric material 4, e.g., polypropylene, ceramics, etc. The dielectric material 4 is then cut or otherwise processed in order to remove undesired dielectric material 4 and thereby form the basic shape of the circuit 2, i.e., both a generally linear surface 6, along one elongate side of the dielectric material 4, and a generally stepped shaped surface 8, along an opposite elongate side of the dielectric material 4, with the dielectric material 4 located therebetween. As shown in this Figure, the generally stepped shaped surface 8 is formed to produce a series of at least seven steps or stages 10 with each step or stage 10 being located progressively further away from the associated generally linear surface 6. For example, the first step or stage 10' may be spaced from the generally linear surface 6 by a distance of a few thousands of an inch or so, the second step or stage 10" may be spaced from the generally linear surface 6 by a distance of 15 to 20 thousands of an inch or so, the third or stage 10''' may be spaced from the generally linear surface 6 by a distance of 60 to 80 thousands of an inch or so, and so forth.

Next, both the generally linear surface 6 and the generally stepped shaped surface 8 are each covered with a thin layer of a copper material 12 (e.g., by an electroplating process for example) thereby to form a generally linear ground section 14 of the circuit 2 and also form a generally stepped shaped charged section 16 of the circuit 2. Each step or stage, of the generally stepped shaped charged section 16 of the circuit 2, typically has a thickness of between 0.003 and 0.008 of an inch, a width of between 2.75 inches (7 cm) and 3.15 inches (8 cm) and an axial length—depending upon the frequency—of between 0.39 inches (1 cm) and 15.75 inches (40 cm), for example. The ground section 14 of the circuit 2, on the other hand, typically has a thickness of between 0.003 and 0.008 of an inch, a width of between 2.75 inches (7 cm) and 3.15 inches (8 cm) and an axial length, between 2.75 inches (7 cm) and 110.23 inches (280 cm) or more, for example. That is, the axial length of the ground section 14 of the circuit 2 is equal to a total combined axial length of each of the steps or stages.

As shown in FIG. 1, a final step or stage $Z_{7'}$ of the generally stepped shaped charged section 16 of the circuit 2 and is spaced or otherwise separated from the last step or stage of the generally stepped shaped charged section 16, e.g., the seventh step or stage $Z_7$ in this circuit 2, by a layer of unremoved dielectric material 4'. The final step or stage $Z_{7'}$ typically has a thickness of between 0.003 and 0.008 of an inch, a width of 7 or 8 centimeters and an axial length, typically between 0.39 inches (1 cm) and 15.75 inches (40 cm), for example. As shown in FIG. 1, a left end beginning of the last step or stage $Z_{7'}$ of the charged section 16 of the circuit 2 is axially aligned with a left first end of the final step or stage $Z_7$ while the axial length of the final step or stage $Z_{7'}$ is axially longer than the axial length of the last step or stage $Z_7$ of the charged section 16 of the circuit 2 so that the right end of the final step or stage $Z_{7'}$ terminates at the same axial position as the ground section 14 of the circuit 2 terminates.

As is conventional in the art, a switch 18 is coupled to a first (e.g., left end) axial end of both the ground section 14 and the charged section 16 to facilitate periodic discharge of the circuit 2. This switch 18 may be periodically activated by a laser (not shown), for example, for discharging the circuit 2, as desired. The circuit 2 is also typically charged, via a conventional power supply 19, to a voltage of between 1,000 and 7,000 volts, for example, before being periodically discharged by the switch 18, e.g., a laser being fired at the switch 18 in order to activate the switch 18 and discharge the circuit 2. In a conventional manner, a first contact of the power supply 19 is coupled to the copper material 12 of the ground section 14 while a second contact of the power supply 19 is coupled to the copper material 12 of the charged section 16. In order to complete the circuit 2, a first end of an antenna $Z_L$ is coupled to an opposite second (right) axial end of the ground section 14 while a second end of the antenna $Z_L$ is coupled to an opposite (right) second end of the final step or stage $Z_{7'}$ to facilitate periodic propagation of the high power microwave energy from the circuit to the antenna $Z_L$ and into the surrounding environment. As is conventional in the art, when the circuit 2 is discharged, this causes a high power microwave signal to be generated by the first step or stage $Z_1$. Thereafter, this generated high power microwave signal propagates progressively along the circuit 2, from left to right, and eventually to the antenna $Z_L$ for transmission, e.g., from the first step or stage $Z_1$ to the second step or stage $Z_2$, from the second step or stage $Z_2$ to the third step or stage $Z_3$, from the third step or stage $Z_3$ to the fourth step or stage $Z_4$, from the fourth step or stage $Z_4$ to the fifth step or stage $Z_5$, from the fifth step or stage $Z_5$ to the six step or stage $Z_6$, from the sixth step or stage $Z_6$ to the seven step or stage $Z_7$, from the seven step or stage $Z_7$ to the last step or stage $Z_{7'}$, and from the last step or stage $Z_{7'}$ into the antenna $Z_L$ for transmission. The antenna $Z_L$ then propagates the high-power microwave signal into the surrounding environment and typically toward a desired target 22.

While the above arrangement has worked satisfactory for some applications, there still exists a need for a way to vary the waveform and its spectral content in order to provide a more versatile high-power microwave signal for achieving the desired result.

BRIEF SUMMARY OF THE INVENTION

Wherefore, it is an object of the present invention to overcome the above mentioned shortcomings and drawbacks associated with the prior art.

One embodiment of the invention comprises a tunable-frequency transmission-line-based pulse forming network. It has been found that the waveform (and its spectral content) produced by PFN circuit can be changed if the dielectric filling for at least one, and possibly two or more transmission line segments, forming the PFN circuit, is replaced by nonlinear (or tunable) magnetic and/or dielectric material. Variation of the effective electrical length of one of more transmission line segments enables control of the generated pulse duration and hence its spectral content. As a result, frequency agility for the circuit is thereby obtained.

It has, therefore, been demonstrated both analytically and by numerical simulations that tunable-frequency variant of the pulse-forming network can be implemented if the dielectric material filling at least the first stage, or possibly both the first and second stages of PFN circuit, is replaced by nonlinear or tunable magnetic and/or dielectric material.

Another object of the present invention is to provide an adjustable current, to at least the first step or stage of the of PFN circuit to permit variation of the current supplied thereto and thus vary the magnetic field applied to the first step or stage of the of PFN circuit.

The present invention also relates to a tunable frequency transmission line pulse forming network circuit for forming a waveform having a spectral content, the pulse forming network circuit comprising: a dielectric material; a ground section being formed on one side of the dielectric material; a stepped shaped charged section being formed on an opposite side of the dielectric material, and the charged section having a plurality of stages including a first stage; a power supply being coupled to the pulse forming network circuit for charging the pulse forming network circuit; a switch being coupled to the pulse forming network circuit for periodically discharging the pulse forming network circuit; and an antenna being coupled to the pulse forming network circuit for propagating a high-power microwave signal from the pulse forming network circuit into a surrounding environment; wherein at least the first stage of pulse forming network circuit has one of a tunable magnetic material and a nonlinear magnetic which facilitates adjusting the waveform and the spectral content of the waveform emitted by the pulse forming network circuit into the surrounding environment.

BRIEF DESCRIPTION OF THE DRAWINGS

The accompanying drawings, which are incorporated in and constitute a part of the specification, illustrate various embodiments of the invention and together with the general description of the invention given above and the detailed description of the drawings given below, serve to explain the principles of the invention. The invention will now be described, by way of example, with reference to the accompanying drawings in which:

FIG. 4A is a graph showing the generated voltage waveform of the circuit shown in FIG. 1 while

FIG. 5A1 is a graph showing the generated voltage waveform of the circuit according to FIG. 2, while FIG. 5A2 is a graph showing the spectrum at an output of the tunable-frequency PFN circuit, according to FIG. 2, biased with an external magnetic field of (a) $H_{ext}$=100 kA/m;

FIG. 5B1 is a graph showing the generated voltage waveform of the circuit according to FIG. 2, while FIG. 5B2 is a graph showing the spectrum at an output of the tunable-frequency PFN circuit, according to FIG. 2, biased with an external magnetic field of (a) $H_{ext}$=80 kA/m;

FIG. 5C1 is a graph showing the generated voltage waveform of the circuit according to FIG. 2, while FIG. 5C2 is a graph showing the spectrum at an output of the tunable-frequency PFN circuit, according to FIG. 2, biased with an external magnetic field of (a) $H_{ext}$=60 kA/m;

FIG. 5D1 is a graph showing the generated voltage waveform of the circuit according to FIG. 2, while FIG. 5D2 is a graph showing the spectrum at an output of the tunable-frequency PFN circuit, according to FIG. 2, biased with an external magnetic field of (a) $H_{ext}$=10 kA/m.

It should be understood that the drawings are not necessarily to scale and that the disclosed embodiments are sometimes illustrated diagrammatical and in partial views. In certain instances, details which are not necessary for an understanding of this disclosure or which render other details difficult to perceive may have been omitted. It should be understood, of course, that this disclosure is not limited to the particular embodiments illustrated herein.

DETAILED DESCRIPTION OF THE INVENTION

The present invention will be understood by reference to the following detailed description, which should be read in conjunction with the appended drawings. It is to be appreciated that the following detailed description of various embodiments is by way of example only and is not meant to limit, in any way, the scope of the present invention.

Figure 2:
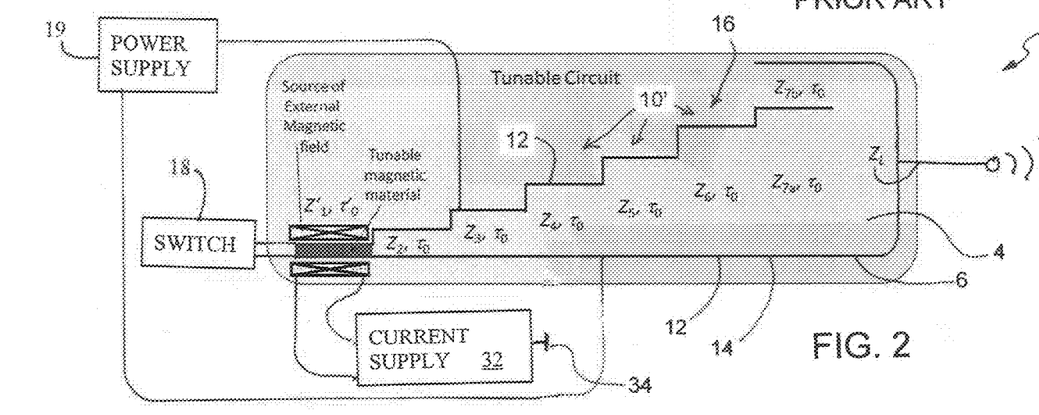
FIG. 2 is a diagrammatic representation showing a single-cycle pulse forming network according to the present invention.
Figure 2A:
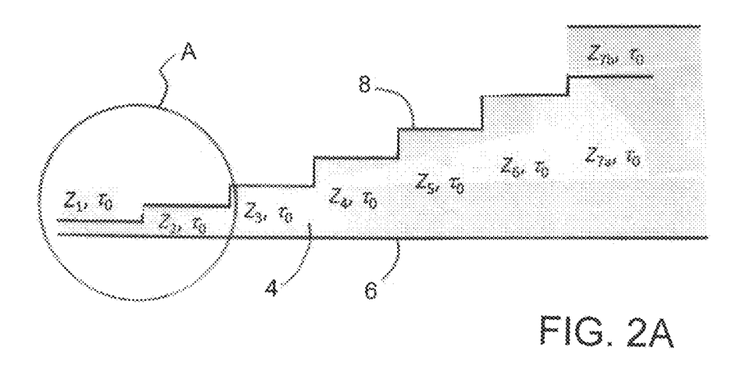
FIG. 2A is a diagrammatic representation showing the dielectric material being formed into the basic shape for forming the single-cycle pulse forming network according to the present invention.
Figure 2B:
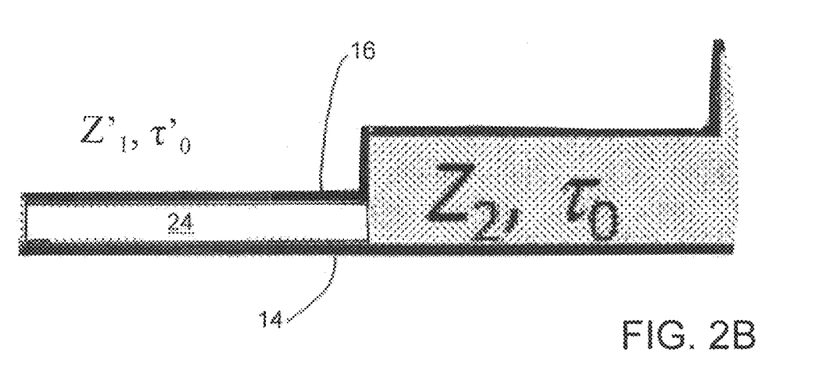
FIG. 2B is an enlarged section A of FIG. 2A showing a hollow space or void formed in the first step or stage of the single-cycle pulse forming network.
Figure 2C:
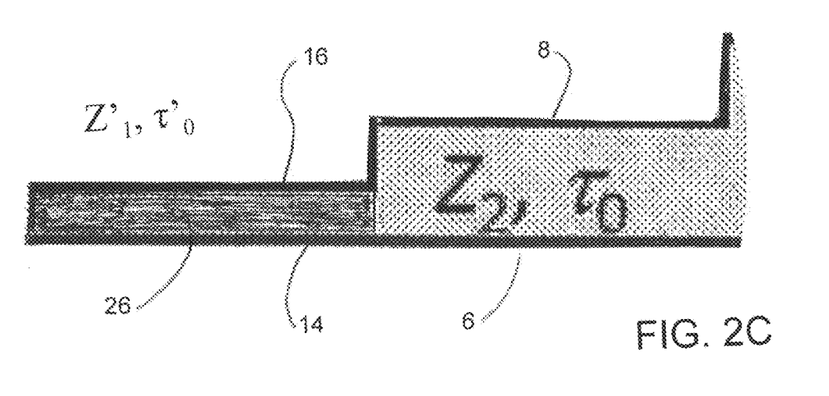
FIG. 2C is a diagrammatic representation showing a tunable magnetic material completely filling the hollow space or void formed in the first step or stage of the single-cycle pulse forming network.

FIG. 2 is a diagrammatic Fig. showing, as an example, a single-cycle PFN circuit 2' according to the present invention. In order to form such single-cycle PFN circuit 2', the dielectric material 4 is first cut or otherwise shaped into the basic shape of the single-cycle PFN circuit 2' as generally shown in FIG. 2A. Next, the dielectric material 4, located between the first step or stage $Z_1$ of the charged section 16 and the ground section 14 of the circuit 2', is substantially cut out and/or removed, as generally shown in FIG. 2B. As shown in this Figure, a substantial portion of the entire dielectric material 4, located between the first step or stage $Z'_1$ of the charged section 16 and the ground section 14 is substantially completely removed so as to form a hollow space or void 24 located between the ground section 14 and the charged section 16 of the circuit 2'. That is, only a very thin layer of the dielectric material 4 still remains to define a perimeter of the hollow space or void 24. Thereafter, as shown in FIG. 2C, a suitable tunable magnetic material 26, such as ferroelectric ceramics (e.g., lead zirconate titanate (PZT)), is inserted into or otherwise completely fills and occupies the hollow space or void 24 formed in the dielectric material 4. It is to be appreciated that, in some applications for example, the layer of the dielectric material 4, located between the first step or stage 10' of the charged section 16 and the ground section 14, may be removed and replaced with the tunable magnetic material which may be secured or affixed, e.g., gluing, fusing, etc., to the remainder of the dielectric material 4 without departing form the spirit and scope of the present invention.

Figure 2D:
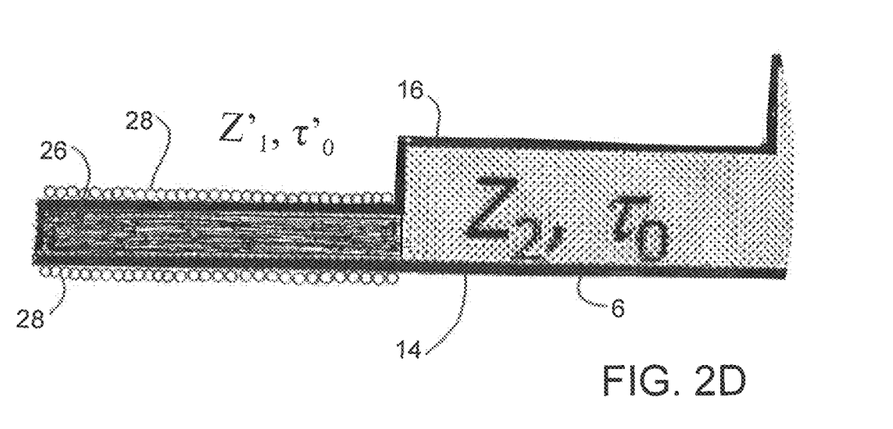
FIG. 2D is a diagrammatic representation showing a wire wrapped around the first step or stage of the charged section to form an external magnetic field source.

Thereafter, a thin wire 28, e.g., having a diameter of 0.2 and 1.0 mm, for example, is then wrapped around the ground section 14, the tunable magnetic material 26, the remaining thin layer of the dielectric material 4, and the first step or stage $Z'_1$ of the charged section 16 of the circuit 2' to form an external magnetic field source 30, as diagrammatically shown FIG. 2D. It is to be appreciated that the wire 28 may be wrapped one or more times around the ground section 14, the tunable magnetic material 26, the remaining thin layer of the dielectric material 4, and the first step or stage $Z'_1$ of the charged section 16 of the circuit 2'. By providing additional wraps of the wire 28, this facilitates the generation of a large magnetic field, by the formed external magnetic field source 30 which thereby results in an increased tuning range according to the present invention.

In order to complete the external magnetic field source 30, as shown in FIG. 2D a first end of the wire 28, which loops or wraps around the first step or stage $Z'_1$ of the charged section 16 of the circuit 2' in order to create a magnetic field, is connected to a first contact of a current supply 32 while a second opposite and the wire is connected to a second contact of the current supply 32. Typically a current of between 2 to 5 amps, for example, is supplied to the external magnetic field source 30 in order to vary the current applied thereto and thereby vary the pulse and the frequency produced by the single-cycle PFN circuit 2'. It is to be appreciated that, depending upon the particular application, a current supply may supply either a greater or lesser amount of current to the external magnetic field source 30. The current supply 32 has a rotatable knob, or some other current supply adjustment mechanism 34, which permits an operator of the current supply to readily alter the current or fixed pulse being supplied to the external magnetic field source 30 of the single-cycle PFN circuit 2' and thereby alter and/or vary the frequency of the outputted high power microwave to be emitted by the transformer or module 36.

The single-cycle PFN circuit 2' of FIG. 2D is then equipped with both a switch 18 and an antenna $Z_L$, as described above and generally shown in FIG. 2, in order to complete formation of the transformer or module 36 according to the present invention.

It is to be appreciated that the electrical length (propagation constant) of the first transmission line segment can be varied if the ferrite is placed into a saturating external static magnetic field perpendicular to the magnetic field in the transient (discharge) pulse so that the magnetization vector in ferrite initially aligned with the static external magnetic field (bias field). The pulsed magnetic field, produced by the discharge of the transmission line, causes the magnetization vector to rotate. It is to appreciated that the rotation of the magnetization vector is described by the Landau-Lifshitz equation:

$$\frac{dM}{dx} = \gamma\mu_0(M \times H) - \frac{\alpha\gamma\mu_0}{M_s}(M \times (M \times H))$$

where M is the magnetization vector,
$M_s$ is the saturation magnetization,
g is the gyromagnetic ratio, and
H is the magnetic field.

The applied pulsed magnetic field exerts a torque on magnetization vector. The basic response to this torque is, therefore, that M precesses around H. However, damping effects mean that, in the longer term, M becomes aligned with H. When coupled to the propagation of the transient along transmission line, this magnetization vector rotation causes a delay in propagation which depends on both 1) the magnitude of the bias magnetic field and 2) the pulsed magnetic field so that the transient propagation velocity along transmission line is expressed as follows:

$$\frac{1}{\sqrt{1 + \frac{b\mu_0 M_s}{\sqrt{H^2 + H_{ext}^2}}}}$$

where b is geometry factor (ferrite filling factor),
$H_{ext}$ is the magnitude of the external bias magnetic field, H is the magnitude of the pulsed (transient) magnetic field, and $v_0$ is the phase velocity in the transmission line when ferrite is saturated in the direction of the pulsed magnetic field (linear case).

Figure 3:
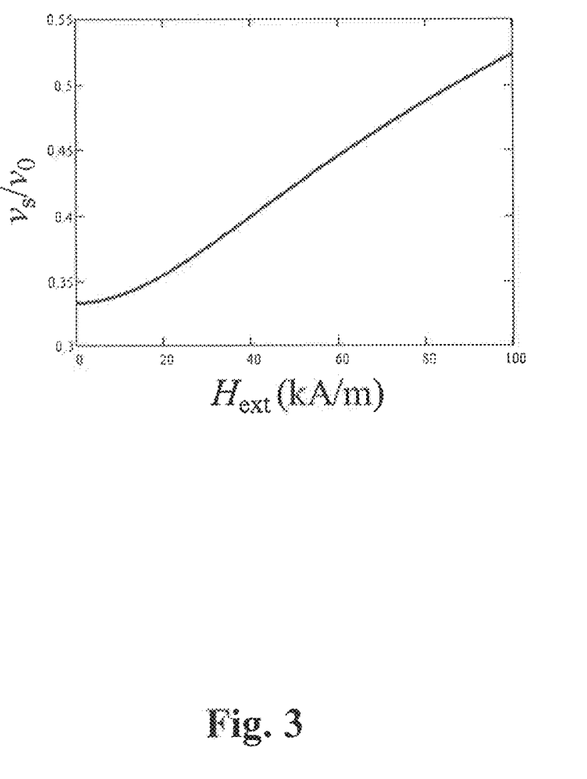
FIG. 3 is a graph showing typical dependence of the transient propagation velocity versus bias magnetic field.

FIG. 3 shows typical dependence of the transient propagation velocity versus the bias applied by the magnetic field which is generated by the external magnetic field source 30.

Figure 4A:
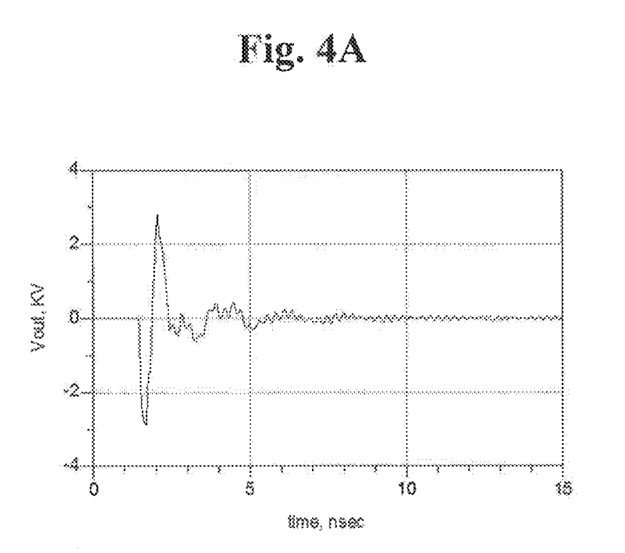
Figure 4B:
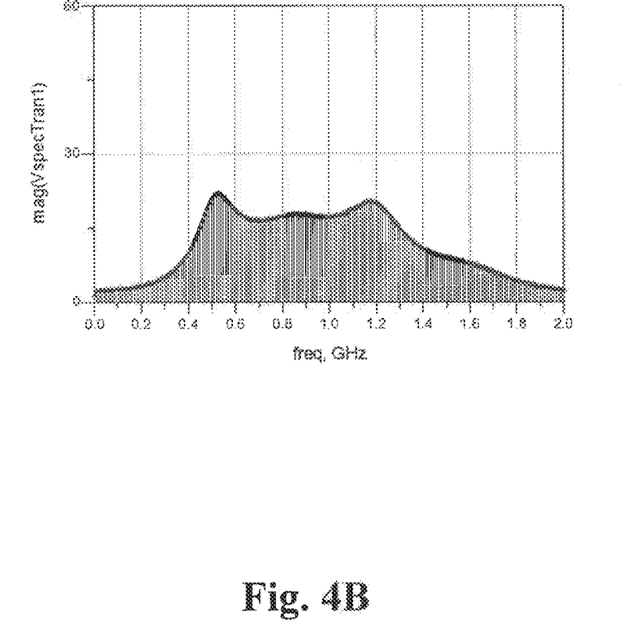
FIG. 4B is a graph showing the spectrum at the output of the circuit shown in FIG. 1.

FIG. 4A is a graph showing the generated voltage waveform of the circuit 2', according to the prior art circuit 2 of FIG. 1, while FIG. 4B is a graph showing the spectrum at the output of the prior art circuit 2 according to FIG. 1.

Figure 5A:
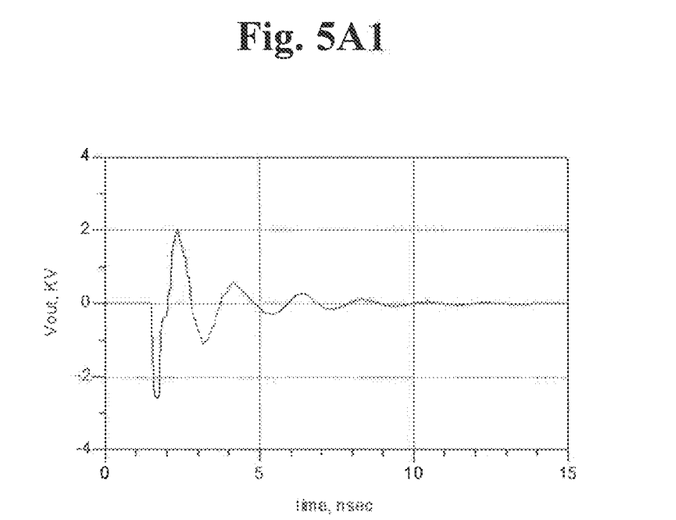
Figure 5A:
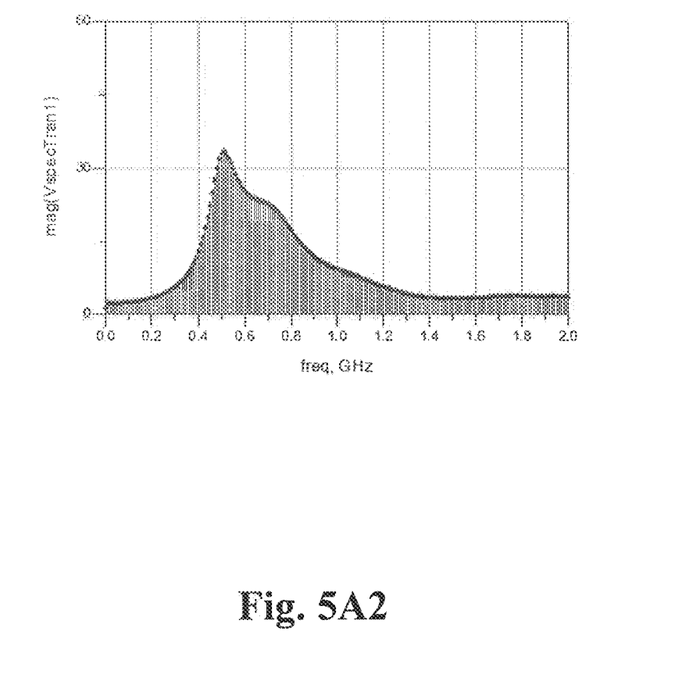
Figure 5B:
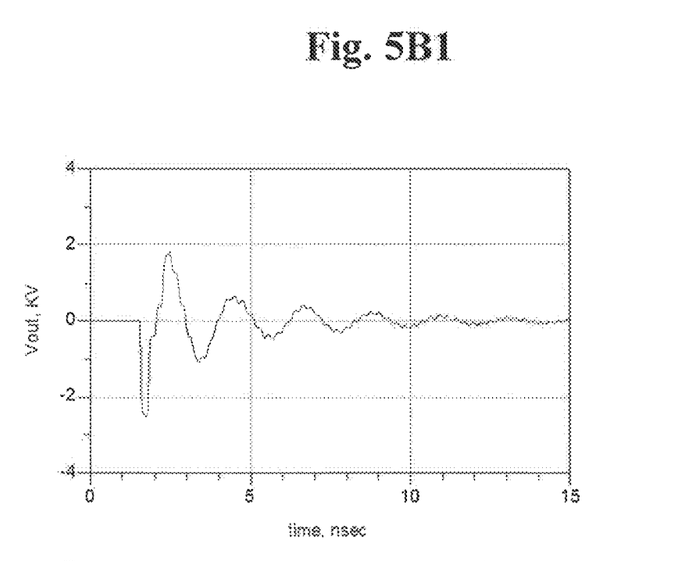
Figure 5B:
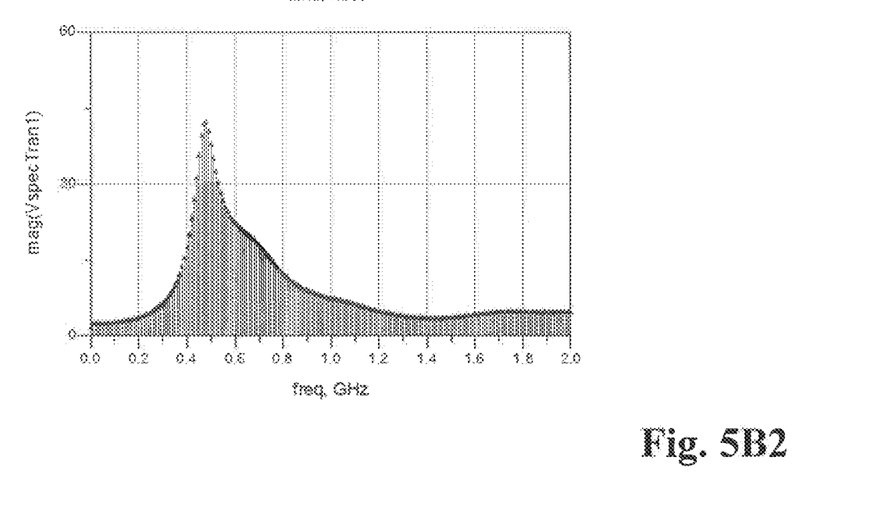
Figure 5C:
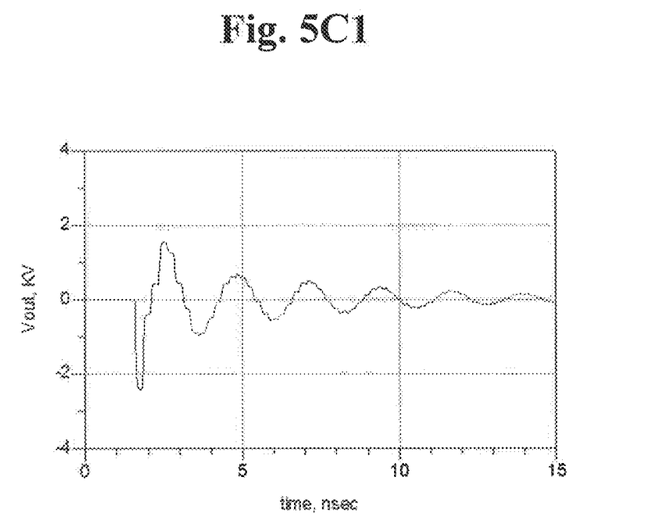
Figure 5C:
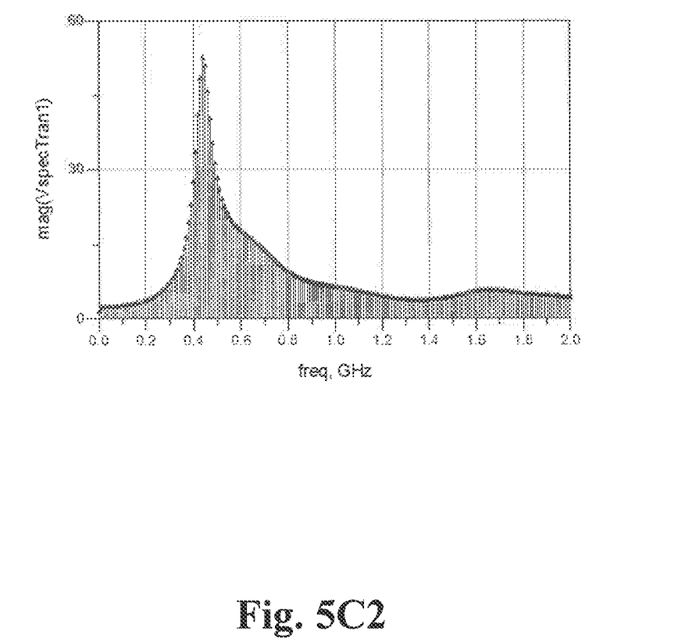
Figure 5D:
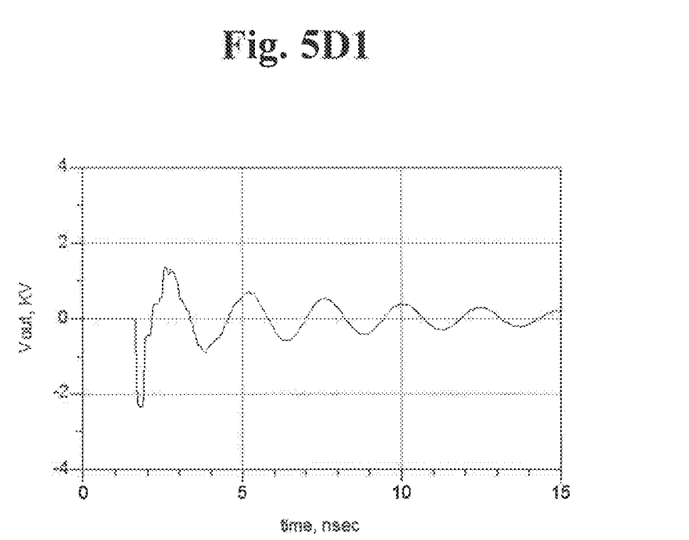
Figure 5D:
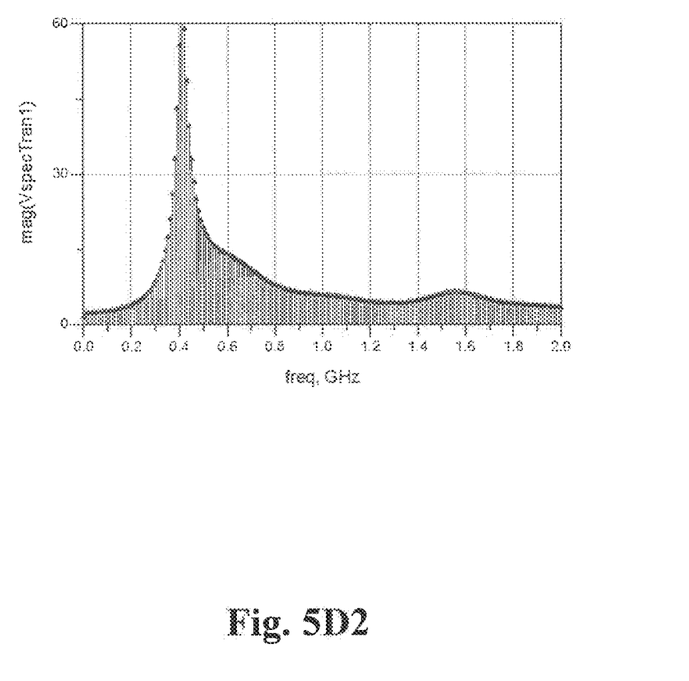

The initial modeling results, according to the present invention, are shown in FIGS. 5A, 5B, 5C and 5D. FIGS. 5A, 5B, 5C and 5D, respectively, show waveforms and their spectra for the tunable PFN circuit 2', according to the present invention for four different values of the external bias magnetic field. FIG. 5A1 is a graph showing the generated voltage waveform while FIG. 5A2 is a graph showing the spectrum at an output of the tunable-frequency PFN circuit 2', according to FIG. 2, biased with an external magnetic field of (a) $H_{ext}$=100 kA/m. FIG. 5B1 is a graph showing the generated voltage waveform while FIG. 5B2 is a graph showing the spectrum at an output of the tunable-frequency PFN circuit 2', according to FIG. 2, biased with an external magnetic field of (a) $H_{ext}$=80 kA/m. FIG. 5C1 is a graph showing the generated voltage waveform while FIG. 5C2 is a graph showing the spectrum at an output of the tunable-frequency PFN circuit 2', according to FIG. 2, biased with an external magnetic field of (a) $H_{ext}$=60 kA/m. FIG. 5D1 is a graph showing the generated voltage waveform while FIG. 5D2 is a graph showing the spectrum at an output of the tunable-frequency PFN circuit 2', according to FIG. 2, biased with an external magnetic field of (a) $H_{ext}$=40 kA/m.

As can readily be seen from FIGS. 5A, 5B, 5C and 5D, the peak output voltage remains constant for each of the four tuning points, although the pulse shape and total number of pulses changes as the transformer or module 36 is tuned by an external bias magnetic field which is generated by the external magnetic field source 30.

Figure 6:
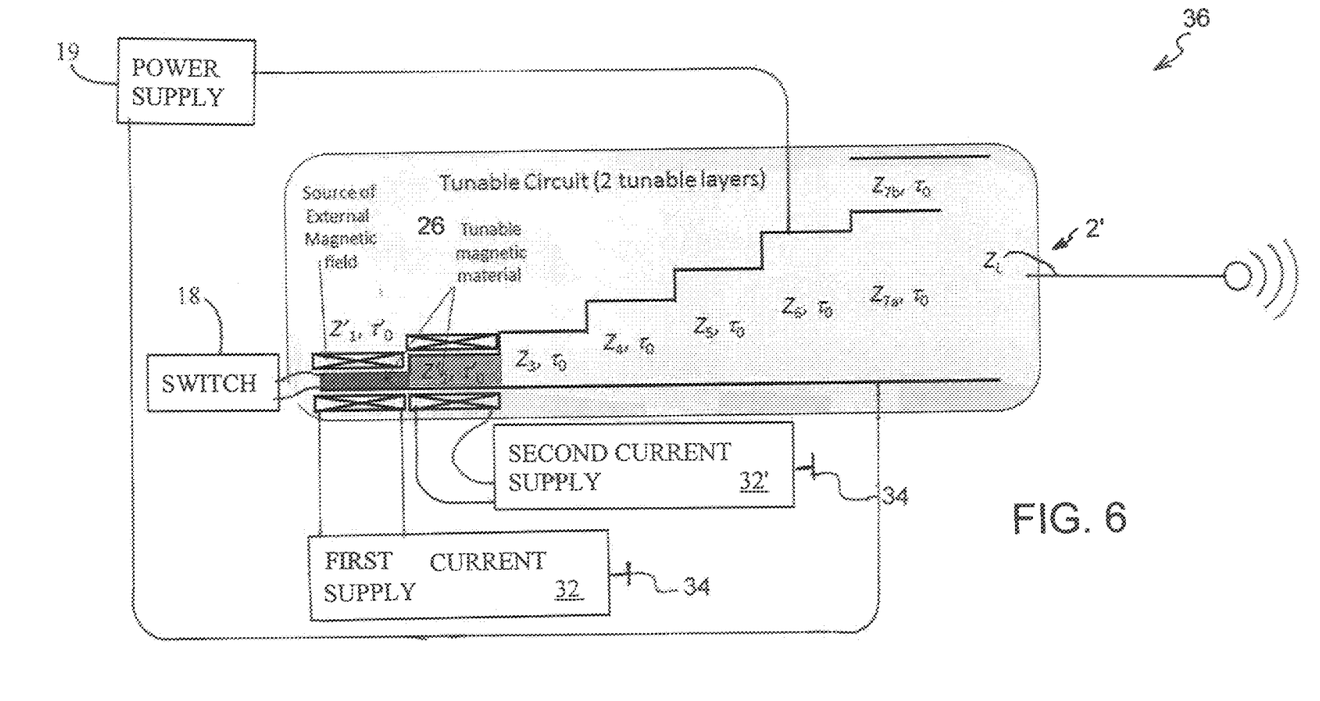
FIG. 6 is a diagrammatic representation showing a single-cycle pulse forming network, according to a further embodiment of the present invention, in which both the first and the second stages are tunable.

The non-tunable prior art circuit 2 was initially designed to produce an ideal bipolar single-cycle waveform. Application of the external magnetic field, which is generated by the external magnetic field source 30, results in variation of the electrical length of at least the first step or stage $Z'_1$ leading to tunable-frequency waveform generation. However, it also results in impedance variation and thus introduces mismatch into the circuit 2' leading to distortion of the ideal single-cycle waveform. As a result, it is desirable to generate a train of oscillations instead of a single pulse. This can be partly compensated by replacing the dielectric material 4—which is non-tunable—with a tunable material in one or more additional steps or stages $Z'_1$, $Z'_2$ etc., of the circuit 2'. For example, as generally shown in FIG. 6, both the first and the second steps or stages $Z'_1$ and $Z'_2$ of the generally stepped shaped charged section 16 of the circuit 2' are each provided with a separate external magnetic field source 30.

According to this embodiment, in addition to the separate external magnetic field source 30 being formed for the first step of stage $Z'_1$, as described above, the dielectric material 4 located between the ground section 14 and the charged section 16 of the circuit 2', for the second step or stage $Z'_2$, is substantially cut out or completely removed and replaced with a tunable magnetic material 26. Thereafter, as described above, a thin wire 28' wraps around the ground section 14, the tunable magnetic material 26, the remaining thin layer of the dielectric material 4, and the second step or stage $Z'_2$ of the charged section 16 of the circuit 2' to form a second external magnetic field source 30'. Lastly, a first end of the wire 28', which loops or wraps around the second step or stage $Z'_2$ of the charged section 16 of the circuit 2' in order to create a magnetic field, is connected to a first contact of a second current supply 32' while a second opposite and the wire is connected to a second contact of the second current supply 32'. The second current supply 32' has a rotatable knob, or some other current supply adjustment mechanism 34', which permits an operator of the second current supply 32' to readily alter the current or fixed pulse being supplied to the second external magnetic field source 30' of the single-cycle PFN circuit 2' and thereby alter and/or vary the frequency of the outputted high power microwave.

If desired, one or more additional steps or stages, e.g., the third step or stage, the fourth step or stage, etc., of the transformer or module 36 may also be similarly equipped with a separate external magnetic field source 30 which facilitates individual tuning of each of those steps or stages of the single-cycle PFN circuit 2', as described above, without departing from the spirit and scope of the present invention. However, it is to be appreciated that providing individual tuning of both the first and the second steps or stages $Z'_1$ and $Z'_2$ of the single-cycle PFN circuit 2' generally provides about 90% of the overall total tunability range of adjustment for the high power microwave to be emitted by the single-cycle PFN circuit 2'.

Furthermore, similar tunability can be enabled by utilizational. As a of nonlinear and tunable dielectrics like BST materials.

While the present invention has been described in connection with the preferred embodiments of various Figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

What is claimed is:

1. A tunable frequency transmission line pulse forming network circuit for forming a microwave signal having a waveform and a spectral content, the pulse forming network circuit comprising:
    a dielectric material;
    a ground section being formed on one side of the dielectric material;

a stepped shaped charged section being formed on an opposite side of the dielectric material, and the charged section having a plurality of stages including a first stage;

a power supply being coupled to the pulse forming network circuit for charging the pulse forming network circuit;

a switch being coupled to the pulse forming network circuit for periodically discharging the pulse forming network circuit; and an antenna being coupled to the pulse forming network circuit for emitting the microwave signal from the pulse forming network circuit into a surrounding environment upon discharge of the pulse forming network circuit;

wherein at least the first stage of the pulse forming network circuit has one of a tunable magnetic material and a nonlinear magnetic material located between the ground section of the first stage and the charged section of the first stage which facilitates adjusting the waveform and the spectral content of the microwave signal emitted by the pulse forming network circuit into the surrounding environment.

2. The tunable frequency transmission line pulse forming network circuit according to claim 1, wherein a copper material extends along an axial length of the charged section, from a first end of the first stage to a second end of a last stage, and a copper material extends along an axial length of the ground section from a first axial end to a second end thereof.

3. The tunable frequency transmission line pulse forming network circuit according to claim 2, wherein the copper material for the charged section and the copper material for the ground section are both deposited on the dielectric material by an electroplating process.

4. The tunable frequency transmission line pulse forming network circuit according to claim 1, wherein a final stage, of the charged section, is spaced from a last stage of the charged section by additional dielectric material.

5. The tunable frequency transmission line pulse forming network circuit according to claim 1, wherein a first contact of the power supply is coupled to the ground section while a second contact of the power supply is coupled to the charged section, and the power supply facilitates charging of the pulse forming network circuit with a voltage of between 1,000 and 7,000 volts.

6. The tunable frequency transmission line pulse forming network circuit according to claim 4, wherein a first end of an antenna is coupled to the ground section while a second end of the antenna is coupled to the final stage of the charged section to facilitate propagation of the high power microwave energy from the antenna into the surrounding environment.

7. The tunable frequency transmission line pulse forming network circuit according to claim 6, wherein a first contact of the power supply is coupled to the ground section while a second contact of the power supply is coupled to the charged section, and the power supply facilitates charging of the pulse forming network circuit with a voltage of between 1,000 and 7,000 volts.

8. The tunable frequency transmission line pulse forming network circuit according to claim 1, wherein a first axial end of the ground section is coupled to a first contact of the switch and a first axial end of the charged section is coupled to a second contact of the switch to facilitate periodic discharge the pulse forming network circuit.

9. The tunable frequency transmission line pulse forming network circuit according to claim 1, wherein a wire is wrapped around the ground section and the charged section of the first stage and the tunable magnetic material of the first stage to partially form an external magnetic field source, and a first contact of a current supply is coupled to one end of the wire while a second opposite end of the wire is connected to a second contact of the current supply in order to complete formation of the external magnetic field source, the current supply having a current supply adjustment mechanism to controllably adjust a current from the current supply and controllably adjust the waveform and the spectral content of the microwave signal.

10. The tunable frequency transmission line pulse forming network circuit according to claim 9, wherein the current of the current supply is adjustable between 2 to 5 amps for varying the current supplied to the external magnetic field source.

11. The tunable frequency transmission line pulse forming network circuit according to claim 1, wherein the dielectric material comprises one of polypropylene and ceramics.

12. The tunable frequency transmission line pulse forming network circuit according to claim 1, wherein the tunable material comprises a ferroelectric ceramic material.

13. The tunable frequency transmission line pulse forming network circuit according to claim 12, wherein the ferroelectric ceramic material is lead zirconate titanate (PZT).

14. The tunable frequency transmission line pulse forming network circuit according to claim 1, wherein at least the first state of the pulse forming network and a second stage of the pulse forming network circuit have one of a tunable magnetic material and a nonlinear magnetic material which facilitates adjusting the waveform and the spectral content of the waveform emitted by the pulse forming network circuit into the surrounding environment.

15. The tunable frequency transmission line pulse forming network circuit according to claim 1, wherein a first wire is wrapped around the ground section and the charged section of the first stage and the tunable magnetic material of the first stage to partially form a first external magnetic field source, and a first contact of a first current supply is coupled to one end of the first wire while a second opposite and the first wire is connected to a second contact of the first current supply in order to complete formation of the first external magnetic field source, and the first current supply having a current supply adjustment mechanism to controllably adjust a current from the first current supply to the first external magnetic field source;

a second wire is wrapped around the ground section and the charged section of a second stage and the tunable magnetic material of the second stage to partially form a second external magnetic field source, and a first contact of a second current supply is coupled to one end of the second wire while a second opposite end of the second wire is connected to a second contact of the second current supply in order to complete formation of the second external magnetic field source, and the second current supply having a current supply adjustment mechanism to controllably adjust a current from the second current supply to the second external magnetic field source such that the first and the second external magnetic field sources are each independently adjustable to controllably adjust the waveform and the spectral content of the microwave signal.

16. The tunable frequency transmission line pulse forming network circuit according to claim 15, wherein the current of the first current supply is adjustable between 2 to 5 amps for varying the current supplied to the first external magnetic field source, and the current of the second current supply is adjustable between 2 to 5 amps for varying the current supplied to the second external magnetic field source.

17. The tunable frequency transmission line pulse forming network circuit according to claim 15, wherein the first wire is wrapped a plurality of times around the ground and the charged sections of the first stage and the tunable magnetic material of the first stage to form the first external magnetic field source, and the second wire is wrapped a plurality of times around the ground and the charged sections of the second stage and the tunable magnetic material of the second stage to form the second external magnetic field source.

18. A tunable frequency transmission line pulse forming network for forming a waveform having a spectral content, the pulse forming network comprises:

at least one of a nonlinear magnetic material and a dielectric material filling in one or more transmission line segments, whereby the waveform and the spectral content thereof are adjustable, the nonlinear magnetic material and the dielectric material being located between a charged section of the pulse forming network and a ground section of the pulse forming network.

19. A tunable frequency transmission line pulse forming network circuit for forming microwave signals having a waveform and a spectral content, the pulse forming network circuit comprising:

a dielectric material;

a ground section being formed on one side of the dielectric material;

a charged section being formed on an opposite side of the dielectric material, the charged section having a first stage and a plurality of following stages, the first stage and the plurality of following stages of the charged section being arranged with respect to the ground section in a stepped manner with the first stage being arranged closest to the ground section;

a power supply having a first lead connected to the charged section and a second lead being connected to the ground section for charging the pulse forming network circuit;

a switch being coupled to an end of the first stage of the charged section and an end of the ground section for periodically discharging a microwave signal from the pulse forming network circuit; and a tunable magnetic material being located along a length of the pulse forming network circuit between the first stage of the charged section and a leading portion of the ground section, and the dielectric material being located along another length of the pulse forming network circuit between the plurality of following stages and a trailing portion of the ground section, the tunable magnetic material having a magnetic field that is adjustable to facilitate adjustment of the waveform and the spectral content of the microwave signal generated along the first stage of the charged section and propagated along the plurality of following stages of the charged section; and an antenna being coupled to the pulse forming network circuit for emitting the microwave signal from the pulse forming network circuit into a surrounding environment.

20. The tunable frequency transmission line pulse forming network circuit according to claim 19, wherein a wire is wrapped around the leading portion of the ground section and the first stage of the charged section;

a current supply having first and second contacts, the first contact coupled to one end of the wire and the second contact coupled to an opposite end of the wire, a current from the current supply and passed through the wire varying the magnetic field of the tunable magnetic material, and the current supply having an adjustment mechanism for controllably adjusting the current from the current supply passed through the wire for controllably adjusting the waveform and the spectral content of the microwave signal.

* * * * *